United States Patent
Jang et al.

(10) Patent No.: US 7,268,573 B2
(45) Date of Patent: Sep. 11, 2007

(54) APPARATUS FOR GENERATING TEST STIMULUS SIGNAL HAVING CURRENT REGARDLESS OF INTERNAL IMPEDANCE CHANGES OF DEVICE UNDER TEST

(75) Inventors: Jin-mo Jang, Suwon-si (KR); Young-bu Kim, Seongnam-si (KR); Jung-hye Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/027,057

(22) Filed: Dec. 30, 2004

(65) Prior Publication Data

US 2005/0146342 A1 Jul. 7, 2005

(30) Foreign Application Priority Data

Jan. 2, 2004 (KR) ............ 10-2004-0000051

(51) Int. Cl.
*G01R 31/02* (2006.01)
*G01R 31/26* (2006.01)

(52) U.S. Cl. ............ 324/765; 324/763; 324/158.1

(58) Field of Classification Search ............ 324/765, 324/754, 427; 327/427, 373, 380; 365/201, 365/230.03, 189.07; 257/48; 438/17, 18
See application file for complete search history.

(56) References Cited

U.S. PATENT DOCUMENTS 3,872,386 A * 3/1975 Luhowy ............ 324/98
3,918,050 A * 11/1975 Dorsman ............ 341/158
4,092,589 A 5/1978 Chau et al. ............ 324/73 R
4,875,484 A * 10/1989 Anzai et al. ............ 607/68
4,947,167 A * 8/1990 James et al. ............ 341/117
5,559,734 A * 9/1996 Saito ............ 365/168
5,694,063 A * 12/1997 Burlison et al. ............ 327/50
5,999,468 A * 12/1999 Lawrence ............ 365/201
6,069,484 A * 5/2000 Sobolewski et al. ............ 324/765
6,954,079 B2 10/2005 Sugimoto et al. ............ 324/763
2002/0041190 A1* 4/2002 Hashimoto ............ 324/765

FOREIGN PATENT DOCUMENTS

JP 5-26953 2/1993
KR 10-2004-0053749 6/2004

* cited by examiner

Primary Examiner—Paresh Patel
(74) Attorney, Agent, or Firm—Mills & Onello LLP

(57) ABSTRACT

An apparatus for generating a current source test stimulus signal having a constant current regardless of an internal impedance value of a device under test includes a voltage source generation unit and a voltage to current (V/I) converter. The voltage source generation unit converts source data stored in internal memory into analog signals, and combines the analog signals and a reference signal of D/C voltage level to generate voltage source test stimulus signals. The V/I converter converts the voltage source test stimulus signals into current source test stimulus signals and outputs the current source test stimulus signal to a device under test. The V/I converter maintains the current levels of the current source test stimulus signals at a predetermined value, regardless of the internal impedance of input pins of the device under test. In this manner, the operating efficiency of the device under test can be accurately determined.

16 Claims, 4 Drawing Sheets

APPARATUS FOR GENERATING TEST STIMULUS SIGNAL HAVING CURRENT REGARDLESS OF INTERNAL IMPEDANCE CHANGES OF DEVICE UNDER TEST

BACKGROUND OF THE INVENTION

This application claims the priority of Korean Patent Application No. 2004-51, filed on Jan. 2, 2004, in the Korean Intellectual Property Office, the disclosure of which is incorporated herein in its entirety by reference.

1. Field of the Invention

The present invention relates to test equipment, and more particularly, to an apparatus for generating a test stimulus signal.

2. Description of the Related Art

After semiconductor devices are fabricated through a manufacturing process, they are examined for defects before being sold. Automatic test equipment (ATE) or IC testers are used to perform such examinations. An ATE is an apparatus which automatically examines the operating efficiency of semiconductor devices, applies test stimulus signals, for example, electric signals, to semiconductor devices under test, and estimates response signals, for example, current values or voltage values of the response signals, output from semiconductor devices under test. An apparatus for generating test stimulus signals is generally used to generate the test stimulus signals applied to the semiconductor devices under test. The test stimulus signals have voltages in a predetermined range. The ATE tests the device under test using voltages of the test stimulus signals.

On the other hand, test stimulus signals having current values that are in a predetermined range are required in order to estimate the operating characteristics of semiconductor devices, especially, semiconductor devices used in communication systems. Accordingly, test stimulus signals having voltage values in a corresponding predetermined range are generated and converted into test stimulus signals having current values in the predetermined range. Conventionally, a resistor is used to convert the test stimulus signals of known voltages into test stimulus signals of known currents.

FIG. 1 is a diagram showing a conventional apparatus for generating test stimulus signal and a device under test. Referring to FIG. 1, an apparatus 10 for generating a test stimulus signal includes a voltage source generation unit 20 and resistances Re1 and Re2. The resistances Re1 and Re2 are connected respectively between output pins 31 and 32, respectively, of the voltage source generation unit 20, and input pins 41 and 42 of a device under test DUT 40. Only two input pins, i.e. 41 and 42 of the DUT 40 are shown in FIG. 1, for simplicity; however, the DUT 40 may have many input pins. Resistances Rn1 and Rn2 in the DUT 40 are equivalent circuits representing parasitic resistances of the input pins 41 and 42, respectively. The voltage source generation unit 20 includes a clock signal generator 21, a source memory 22, a digital to analog D/A converter 23, a low frequency filter 24, an amplification controller 25, a first and second signal combining units 26 and 27, first and second driver amplifiers 28 and 29, and a DC voltage generator 30. The voltage source generation unit 20 generates test stimulus signals TSV1 and TSV2 having predetermined voltages respectively. The test stimulus signals TSV1 and TSV2 are analog signals such as sine waves, and have complementary voltage levels Vpp and Vpn respectively. Since the test stimulus signals TSV1 and TSV2 are analog signals, the voltage levels of Vpp and Vpn are changed periodically.

Referring to FIG. 1, test stimulus signals TSV1 and TSV2 having voltages Vpp, Vpn, are converted into test stimulus signals TSI1 and TSI2 having currents, by the resistances Re1 and Re2. Here, the size of currents Ipp and Ipn flowing in the resistances Re1 and Re2 is determined by the voltages Vpp and Vpn, and bias voltages Vpin1 and Vpin2 in the DUT 40, as indicated in the following equation.

$$Ipp = \frac{(Vpp - Vpin1)}{Re1} \quad (1)$$

$$Ipn = \frac{(Vpn - Vpin2)}{Re2}$$

In the Equation 1, the bias voltages Vpin1 and Vpin2 are determined by internal impedances in the DUT 40, namely, by the resistances Rn1 and Rn2 of the input pins 41 and 42 and the currents Ipp and Ipn. Therefore, when values of the resistances Rn1 and Rn2 are changed, levels of the bias voltages Vpin1 and Vpin2 may be changed. Also, referring to Equation 1, the currents Ipp and Ipn are affected by the bias voltages Vpin1 and Vpin2. Here, since the bias voltage Vpin1 is Ipp×Rn1 and the bias voltage Vpin2 is Ipn×Rn2, the currents Ipp and Ipn are represented by the following equation.

$$Ipp = \frac{Vpp}{(Re1 + Rn1)} \quad (2)$$

$$Ipn = \frac{Vpn}{(Re2 + Rn2)}$$

The currents Ipp and Ipn, which are applied to the input pins 41 and 42 respectively, should be equal in order to correctly test the operating efficiency of the DUT 40. The bias voltages Vpin1 and Vpin2 should be equivalent to each other in order to let the currents Ipp and Ipn be equivalent to each other. However, it is very difficult to fabricate a DUT having the same bias voltages Vpin1 and Vpin2, because the values of the resistances Rn1 and Rn2 of the input pins 41 and 42 vary in accordance with the conditions of a process for fabricating the DUT.

For example, assuming that the resistances Re1 and Re2 are both 1Ω, and the resistances Rn1 and Rn2 are 3Ω and 1Ω, respectively, the voltages Vpp and Vpn are converted into currents in the range of 8-12 mA. Applying the above values to Equation 2, the resulting current Ipp is in the range of 2-3 mA, while the current Ipn is in the range of 4-6 mA. In this manner, a difference between the currents Ipp and Ipn applied to the input pins 41 and 42, occurs because of a difference in the values of the respective resistances Rn1 and Rn2 of the input pins 41 and 42.

In this case, the currents Ipp and Ipn are adjusted until they are equal by adjusting the levels of the voltages Vpp and Vpn. For example, by adjusting the voltage Vpp to be in the range of 8-12 mV and the voltage Vpn to be in the range of 4-6 mV, the currents Ipp and Ipn then become equivalent in the range of 2-3 mA.

However, referring to FIG. 1, equal DC voltages are input to the input terminals of the first and second driver amplifiers 28 and 29 by the DC voltage generator 30. Therefore, in this configuration, it is impossible or impractical to adjust the voltages Vpp and Vpn to be different from each other.

FIGS. 2A through 2C illustrate waveforms of test stimulus signals TSI1 and TSI2 generated by the apparatus 10 for generating test stimulus signals shown in FIG. 1. FIGS. 2A through 2C show waveforms of the test stimulus signals TSI1 and TSI2 when values of internal impedances in the DUT 40, namely, the values of resistances Rn1 and Rn2, are 50Ω, 100Ω, and 150Ω respectively. Referring to FIGS. 2A through 2C, the currents Ipp and Ipn of the test stimulus signals TSI1 and TSI2 decrease as the values of the internal impedances in the DUT 40 increase.

As described above, since the currents Ipp and Ipn of the test stimulus signals TSI1 and TSI2 generated by the conventional apparatus 10 for generating test stimulus signals vary in accordance with variance in the internal impedance values of the DUT 40, there is a limitation in that the operating efficiency of the DUT 40 cannot be tested accurately.

SUMMARY OF THE INVENTION

The present invention provides an apparatus for generating a test stimulus signal in order to test accurately the operation efficiency of a device under test by generating a test stimulus signal having a specified current, irrespective of the internal impedance value of a device under test.

According to an aspect of the present invention, in the test system testing the operation efficiency of a device under test, there is provided an apparatus for generating a test stimulus signal, and for outputting the same to input pins of the device under test The apparatus comprises a voltage source generation unit and a V/I converter. The voltage source generation unit converts source data stored in the internal memory to an analog signal, and generates a voltage source test stimulus signal by combining the analog signal and a reference signal at a DC voltage level. A V/I converter converts voltage source test stimulus signals into current source test stimulus signals, and outputs the same to the input pins of the device under test. The V/I converter maintains the current levels of the current source test stimulus signals at a constant level regardless of variations in the internal impedance at input pins of the device under test.

In one embodiment, the voltage source test stimulus signals are output through output pins of the voltage source generation unit, and the V/I converter is connected to the output pins of the voltage source generation unit. A plurality of V/I conversion circuits convert the voltage source test stimulus signals having fixed analog voltage levels into the current source test stimulus signals having currents of designated levels.

Each of the of V/I conversion circuits comprises: an operational amplifier (OP amp) having a non-inverting terminal connected to the voltage source generation unit via a first resistor, an inverting terminal connected to a ground voltage via a second resistor, and an output terminal connected to a first node, that outputs a first voltage to the first node in response to the fixed analog voltage applied to the non-inverting terminal; a third resistor forming a negative feedback loop with the OP amp, connected between the inverting terminal of the OP amp and the first node; a fourth resistor forming a positive feedback loop with the OP amp, connected between the non-inverting terminal of the OP amp and a second node; and a fifth resistor connected between the first node and the second node, wherein a first current determined by the first voltage of the first node and a second voltage of the second node, flows through the fifth resistor.

In one embodiment, the second voltage is an internal bias voltage of the device under test. The first current is divided into a second current and a third current at the second node, and each of the current source test stimulus signals has a level that is substantially equal to that of the second current. The resistance of the fourth resistor is larger than the resistance of the fifth resistor, and the second current is larger than the third current flowing through the fourth resistor. The fixed analog voltage is equal to a difference between the first voltage and the second voltage. When the resistance of the fifth resistor is changed, the size of the first current is changed. In one embodiment, the first through fourth resistors all have substantially the same resistance value.

In one embodiment, the voltage source generation unit generates pairs of voltage source test stimulus signals having complementary voltage levels and the V/I converter includes pairs of V/I conversion circuits that convert the pairs of voltage source test stimulus signals into pairs of current source test stimulus signals and that output the pairs of current source test stimulus signals, wherein the currents of each pair of current source test stimulus signals have levels that are within a predetermined range.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
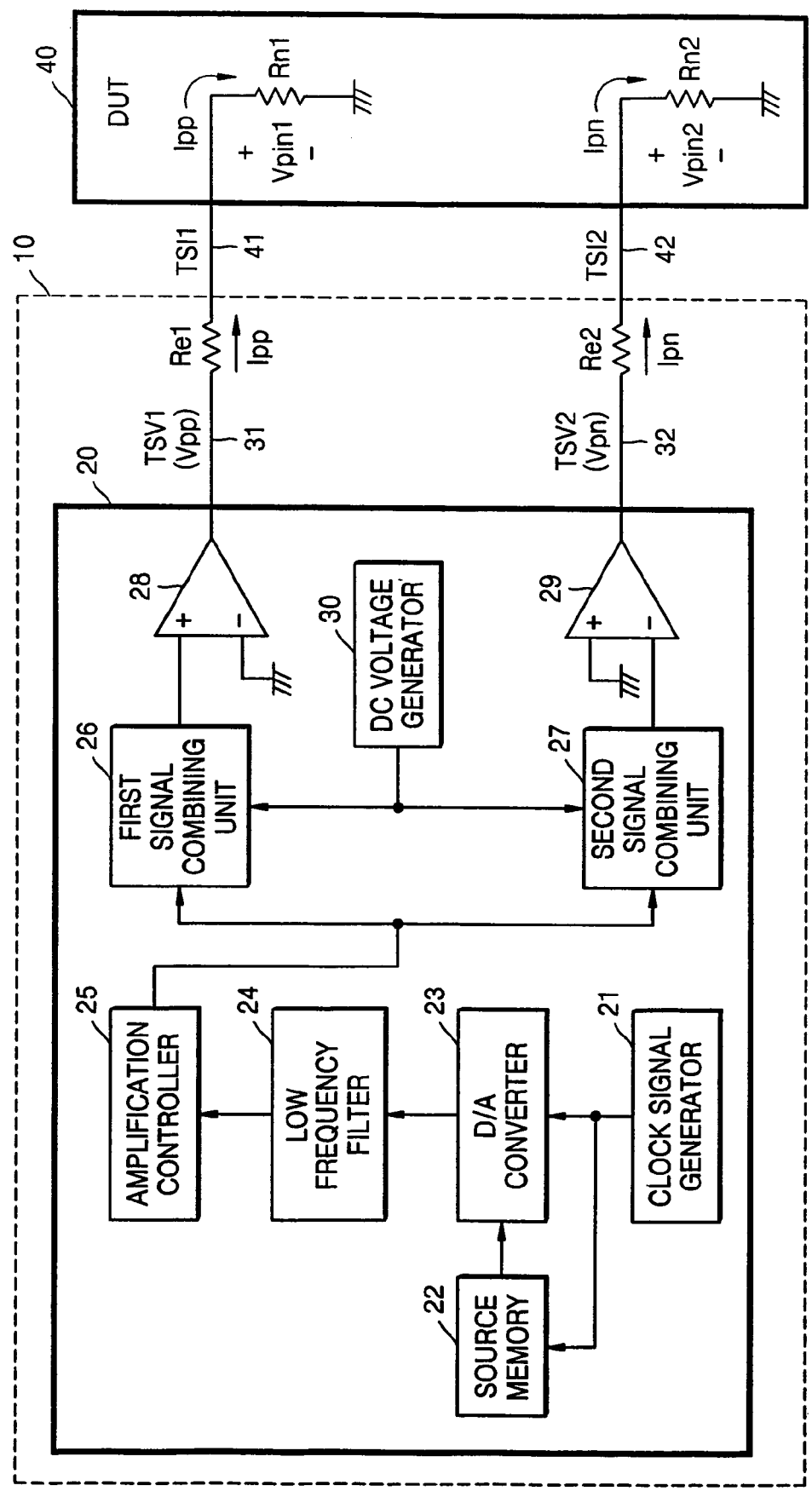
FIG. 1 is a diagram illustrating an apparatus for generating test stimulus signals and a device under test according to the prior art.
Figure 2A:
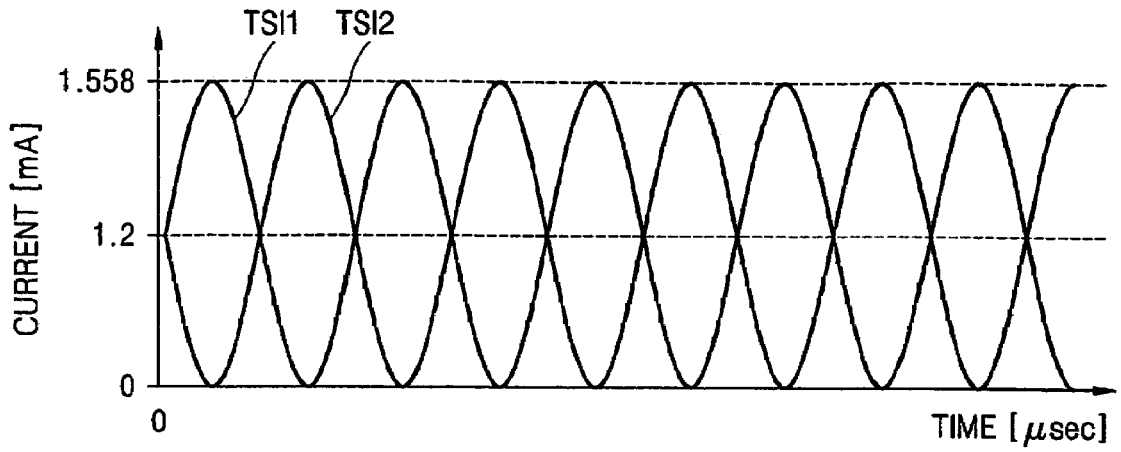
FIGS. 2A through 2C are diagrams illustrating waveforms of test stimulus signals generated by the apparatus for generating test stimulus signals shown in FIG. 1.
Figure 2B:
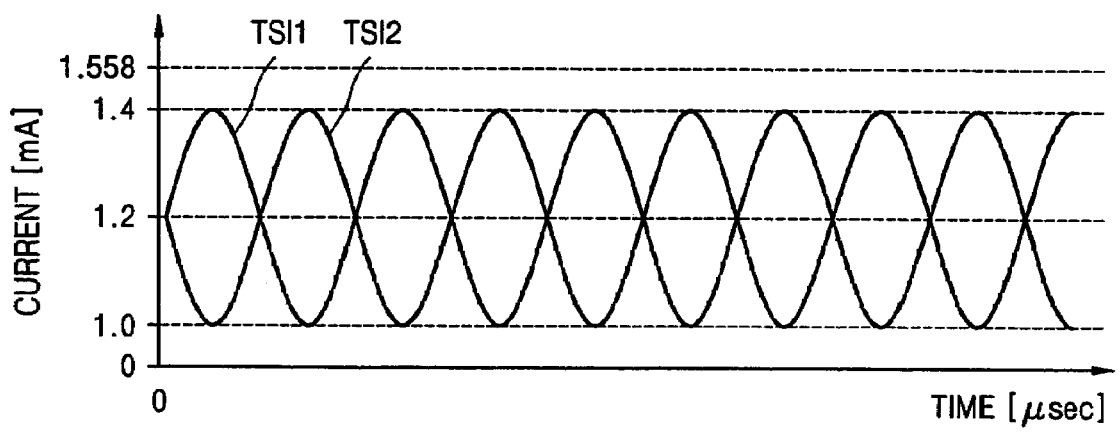
Figure 2C:
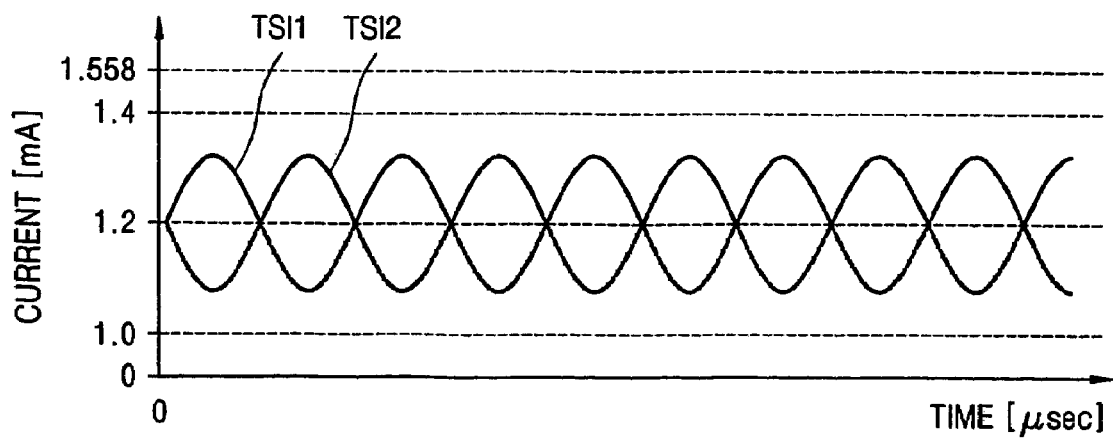

The attached drawings for illustrating preferred embodiments of the present invention are referred to in order to gain a sufficient understanding of the present invention, the merits thereof, and the objectives accomplished by the implementation of the present invention. Hereinafter, the present invention will be described in detail by explaining preferred embodiments of the invention with reference to the attached drawings. Like reference numerals in the drawings denote like elements.

Figure 3:
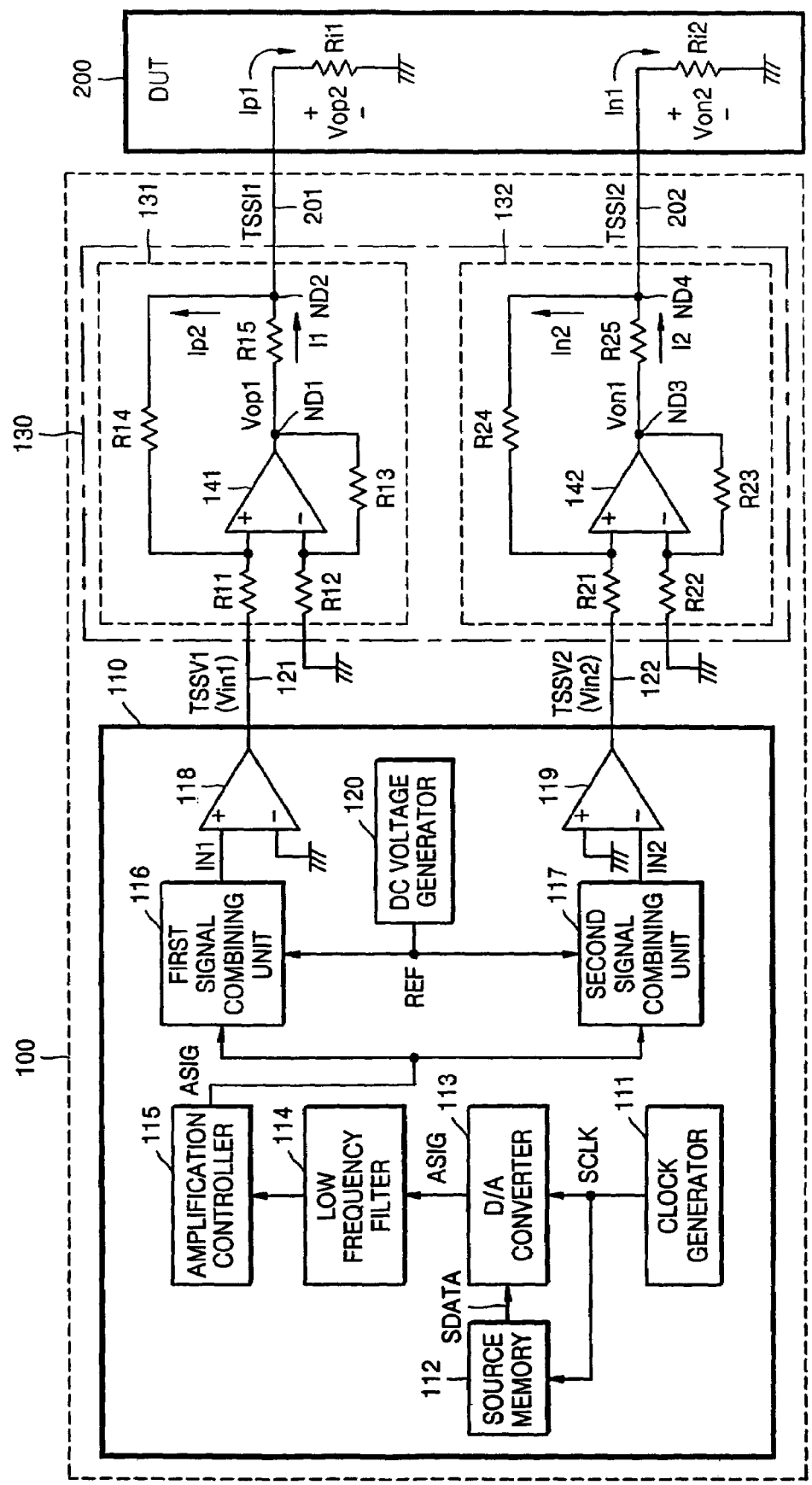
FIG. 3 is a diagram illustrating an apparatus for generating test stimulus signals and a device under test according to the present invention.

FIG. 3 is a diagram illustrating an apparatus for generating test stimulus signals and a device under test. Referring to FIG. 3, an apparatus 100 for generating test stimulus signals includes a voltage source generation unit 110 and a voltage to current (V/I) converter 130. The voltage source generation unit 110 generates test stimulus signals TSSV1 and TSSV2 with designated voltage levels Vin1 and Vin2. Hereinafter, the test stimulus signals TSSV1 and TSSV2 are referred to as voltage source test stimulus signals. The voltage source generation unit 110 includes a clock generator 111, a source memory 112, a D/A converter 113, a low frequency filter 114, an amplification controller 115, first and second signal combining units 116 and 117, a pair of driver amplifiers (amps) 118 and 119, and a DC voltage generator 120. The clock generator 111 generates a sampling clock signal SCLK. As shown in FIG. 3, the voltage source generation unit 110 includes a pair of driver amplifiers 118 and 119, however the voltage source generation unit 110 may include additional driver amplifiers. The source memory 112 stores sampling data SDATA, which is source data for a test stimulus signal, responds to the sampling clock signal SCLK and outputs the sampling data SDATA. The D/A converter 113 responds to the sampling clock signal SCLK and converts the sampling data SDATA into an analog signal ASIG. The low frequency filter 114 filters the analog signal ASIG and outputs only a low frequency element. The amplification controller 115 controls an amplification rate of the analog signal ASIG received from the low frequency filter 114, and amplifies and outputs the analog signal ASIG in accordance with the controlled amplification rate. The first and second signal combining units 116 and 117 combine the analog signal ASIG amplified by the amplification controller 115 and a reference signal REF having a DC voltage level generated by the DC voltage generator 120, and output internal signals IN1 and IN2 respectively. The internal signal IN1 is input to the non-inverting terminal + of the driver amp 118, and the inverting terminal − of the driver amp 118 is connected to the ground voltage. Also, the internal signal IN2 is input to the inverting terminal − of the driver amp 119, and the non-inverting terminal + of the driver amp 119 is connected to the ground voltage. The driver amps 118 and 119 respond to the internal signals IN1 and IN2, and output the voltage source test stimulus signals TSSV1 and TSSV2 to output pins 121 and 122.

The voltage source test stimulus signals TSSV1 and TSSV2 are analog signals such as sine waves, and have complementary voltage levels Vin1 and Vin2. Since the voltage source test stimulus signals TSSV1 and TSSV2 are analog signals, the respective voltages Vin1 and Vin2 are changed periodically.

The V/I converter 130 converts the voltage source test stimulus signals TSSV1 and TSSV2 received from the voltage source generation unit 110, into test stimulus signals TSSI1 and TSSI2 having predetermined currents, and outputs the test stimulus signals TSSI1, TSSI2. Hereinafter, the test stimulus signals TSSI1 and TSSI2 are referred to as current source test stimulus signals. The V/I converter 130 includes first and second V/I conversion circuits 131 and 132 connected to the output pins 121 and 122 of the voltage source generation unit 110 respectively. The first V/I conversion circuit 131 includes resistors R11, R12, R13, R14, R15 and an operational (OP) amp 141. Resistor R11 is connected between the output pin 121 of the voltage source generation unit 110 and the non-inverting terminal + of the OP amp 141, resistor R12 is connected between the ground voltage and an inverting terminal − of the OP amp 141. Resistor R13 is connected between the inverting terminal − of the OP amp 141 and a node ND1 at an output of the OP amp 141, and forms a negative feedback loop of the OP amp 141. Resistor R14 is connected between the non-inverting terminal + of the OP amp 141 and a node ND2, and forms a positive feedback loop of the OP amp 141. One terminal of resistor R15 is connected to the node ND1, and the other terminal of resistor R15 is connected to the node ND2 and an input pin 201 of a DUT 200.

The OP amp 141 outputs a voltage Vop1 to the node ND1 in response to the voltage source test stimulus signal TSSV1 having the voltage level of Vin1, which is input to the non-inverting terminal +. On the other hand, the voltage at the node ND2 becomes Vop2. The voltage Vop2 is an internal bias voltage of the DUT 200, namely, a voltage generated by an internal resistance of the DUT 200 represented by a resistor Ri1. Therefore, when resistor Ri1 is varied, the voltage Vop2 is likewise varied. Resistor Ri1 is an equavalent circuit representing the parasitic resistance of the input pin 201 of the DUT 200. The following equation represents a relation of the voltages Vin1, Vop1 and Vop2.

$$Vop1 = Vin1 + Vop2, \text{ therefore, } Vin1 = Vop1 - Vop2 \qquad (3)$$

Referring to Equation 3, the voltages Vin1 and Vop2 determine the voltage Vop1. Also, when the internal bias voltage Vop2 of the DUT 200 increases or decreases, the voltage Vop1 output from the OP amp 141 increases or decreases at the same rate as the rate of the voltage Vop2. Therefore, the voltage Vin1, which is the difference between the voltages Vop1 and Vop2, is maintained within a prescribed range.

A current I1 determined by the voltages Vop1 and Vop2, flows through resistor R15, and the current I1 is divided into a current Ip1 and a leakage current Ip2 at the node ND2. The current source test stimulus signal TSSI1 output from the node ND2, has a current value of Ip1. If the resistance of resistor R14 is set much larger than the resistance of resistor R15, the leakage current Ip2 flowing through the resistance R14 is reduced, and the current Ip1 is almost the same as the current I1.

The resistance values of resistors R11, R12, R13 and R14 may be all the same, and the resistance of resistor R15 may be set to a value which is much smaller than the resistances of resistors R11, R12, R13 and R14. For example, when the resistances of resistors R11, R12, R13 and R14 are fixed to 100 kΩ, the resistance of resistor R15 may be fixed to 1 kΩ. The following equation may be used to calculate the current I1 flowing through resistor R15:

$$I1 = \frac{Vin1}{R15} \text{(here, } Vin1 = Vop1 - Vop2\text{)} \qquad (4)$$
$$= \frac{(Vop1 - Vop2)}{R15}$$

Referring to Equation 4, the voltages Vop1 and Vop2 and resistor R15 determine the size of current I1. Therefore, the size of the current I1 may be controlled by changing the resistance of resistor R15. Also, referring to Equation 3, to maintain the voltage Vin1 within a prescribed range as described above, the current I1 can be kept within a prescribed range regardless of internal impedance of the DUT 200. Finally, a value of the current Ip1 of the current source test stimulus signal TSSI1 applied to the input pin 201 of the DUT 200, is maintained within a prescribed range.

The V/I converter circuit 132 includes resistors R21, R22, R23, R24 and R25 and an OP amp 142. Resistor R21 is connected between the output pin 122 of the voltage source generation unit 110, and the non-inverting terminal + of the OP amp 142, and resistor R22 is connected between the ground voltage and the inverting terminal − of the OP amp 142. Resistor R23 is connected between the inverting terminal − of the OP amp 142 and a node ND3 at an output of the OP amp 142. Resistor R24 is connected between the non-inverting terminal + of the OP amp 142 and a node ND4. One terminal of resistor R25 is connected to the node ND3 and the other terminal of resistor R25 is connected to the node ND4 and to an input pin 202 of the DUT 200.

The OP amp 142 outputs a voltage Von1 to the node ND3, in response to the voltage source test stimulus signal TSSV2 having the voltage level of Vin2, which is input to the non-inverting terminal +. On the other hand, the voltage at the node ND4 becomes Von2. The voltage Von2 is an internal bias voltage of the DUT 200, namely, a voltage generated by an internal resistance represented by a resistor Ri2. Therefore, when the resistance value of resistor Ri2 varies, the voltage Von2 likewise changes. Resistor Ri2 is an equivalent circuit representing the parasitic resistance of the input pin 202 of the DUT 200. The following equation represents the relation of the voltages Vin2, Von1 and Von2.

$$\text{Von1}=\text{Vin2}+\text{Von2, therefore, Vin2}=\text{Von1}-\text{Von2} \quad (5)$$

Referring to Equation 5, the voltages Vin2 and Von2 determine the voltage Von1. Also, when the internal bias voltage Von2 of the DUT 200 increases or decreases, the voltage Von1 output from the OP amp 142 increases or decreases with the same rate as the rate of the voltage Von2. Therefore, the voltage Vin2, which is the difference between the voltages Von1 and Von2, is maintained within a prescribed range.

A current I2, determined by the voltages Von1 and Von2, flows through resistor R25, and the current I2 is divided into a current In1 and a leakage current In2 at the node ND4. The current source test stimulus signal TSSI2 output from the node ND4, has a current value of In1. If the resistance of resistor R24 is set much larger than the resistance of resistor R25, the leakage current In2 flowing through resistor R24 is reduced, and the current In1 is almost the same as the current I2.

The resistances of resistors R21, R22, R23 and R24 may be all the same, and the resistance of resistor R25 may be set to a value which is much smaller than the resistances of resistors R21, R22, R23 and R24. For example, when resistance values of the resistances R21, R22, R23 and R24 are fixed to 100 kΩ, the resistance of resistor R25 may be fixed to 1 kΩ. Also, the sizes of resistors R21, R22, R23 and R24 and resistors R21, R22, R23 and R24 may be the same, and the sizes of resistors R15 and R25 may be the same. The following equation may be used to calculate the current I2 flowing through the resistor R25.

$$I2 = \frac{Vin2}{R25} \text{(here, } Vin2 = Von1 - Von2\text{)} \quad (6)$$
$$= \frac{(Von1 - Von2)}{R25}$$

Referring to Equation 6, the voltages Von1 and Von2 and resistor R25 determine the size of current I2. Therefore, the size of the current I2 may be controlled by changing the resistance of resistor R25. Also, referring to Equation 5, to maintain the voltage Vin2 in a prescribed range as described above, the current I2 can be kept within a prescribed range regardless of internal impedance of the DUT 200. Finally, a value of the current In1 of the current source test stimulus signal TSSI2 applied to the input pin 202 of the DUT 200, is maintained within a prescribed range.

As described above, the apparatus 100 for generating a test stimulus signal provides currents Ip1 and In1 that are almost the same as each other to the input pins 201 and 202, even in the case where there is a difference between the internal bias voltages Vop2 and Von2 due to a difference in the effective resistances Ri1 and Ri2 in the DUT 200. For example, assuming that the voltages Vin1 and Vin2 are both 1V, the voltage Vop2 is 2V, and the Von2 is 2.5V. In this case, using Equations 3 and 5, it is determined that the voltage Vop1 becomes 3V and the voltage Von1 becomes 3.5V. If the internal bias Vop2 and Von2 of the DUT 200 are changed, the voltages Vin1 and Vin2 are kept within a prescribed range, therefore, the size of the currents Ip1 and In1 input to the input pins 201 and 202 can be kept the same.

When the voltage source generation unit 110 further includes additional driver amplifiers, the voltage source generation unit 110 may further include output pins in accordance with the number of additional driver amps, and additional V/I conversion circuits are connected to the additional output pins accordingly.

Figure 4A:
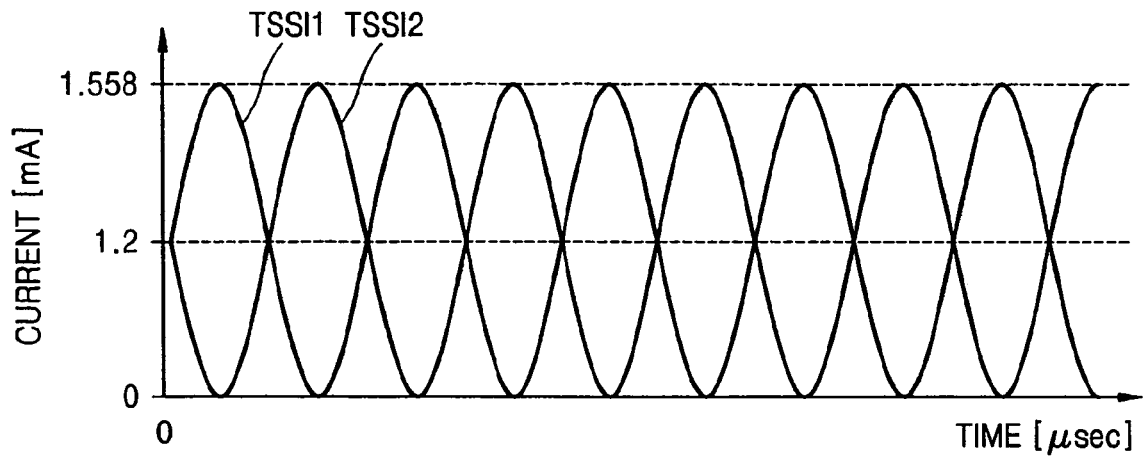
FIG. 4 is a diagram illustrating waveforms of test stimulus signals generated by the apparatus for generating test stimulus signals shown in FIG. 3.
Figure 4B:
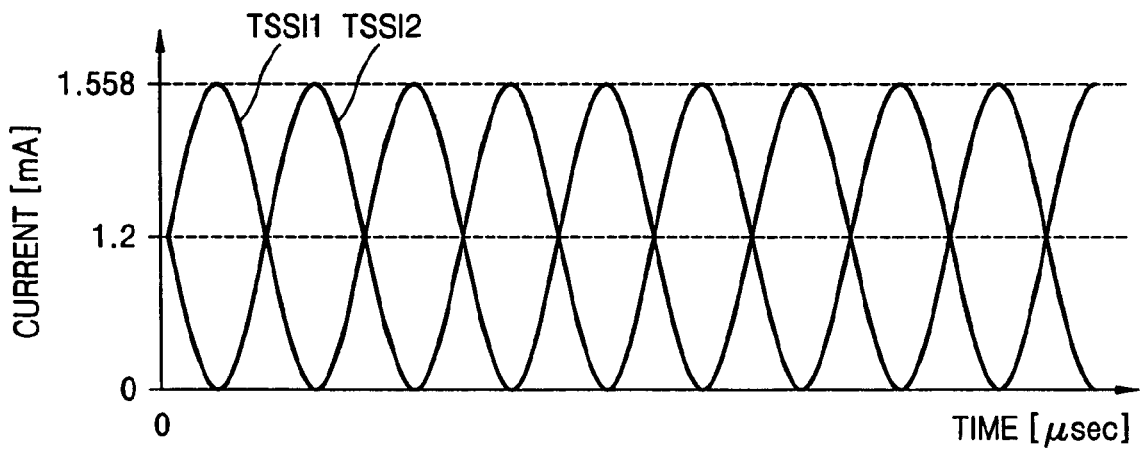
Figure 4C:
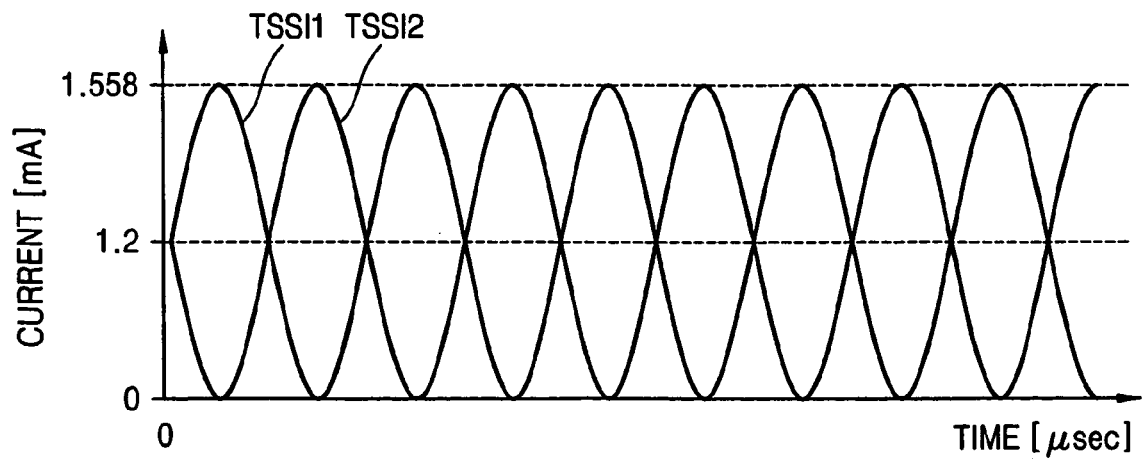

Referring to FIGS. 4A through 4C, the relationship between the currents Ip1 and In1 of the current source test stimulus signals TSSI1 and TSSI2 generated by an apparatus 100 for generating test stimulus signals according to the present invention and the internal impedance values of the DUT 200 are described. FIGS. 4A through 4C are diagrams illustrating waves of the current source test stimulus signals TSSI1 and TSSI2 generated by the apparatus 100 for generating test stimulus signals shown in FIG. 3.

FIGS. 4A through 4C show waveforms of the current source test stimulus signals TSSI1 and TSSI2 when the internal impedances in the DUT 200, namely, the values of resistors Ri1 and Ri2, are 50Ω, 100Ω, and 150Ω. Referring to FIGS. 4A through 4C, the currents Ip1 and In1 of the current source test stimulus signals TSSI1 and TSSI2 are kept being constant regardless of the internal impedances of the DUT 200. Even if the resistances of resistors Ri1 and Ri2 of the input pins 201 and 202, respectively, of the DUT 200, are different from each other, the currents Ip1 and In1 are kept the same. As a result, the operating efficiency of the DUT 200 may be tested accurately.

As described above, an apparatus for generating test stimulus signals according to the present invention generates a current source test stimulus signal which has a constant current regardless of changes in internal impedance of a device under test, in order to test the operation efficiency of the device under test.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for generating test stimulus signals in a test system testing the operation efficiency of a device under test, the apparatus comprising:

a voltage source generation unit that converts source data stored in an internal memory into an analog signal, and that generates voltage source test stimulus signals by combining the analog signal and a reference signal at a DC voltage level; and a voltage to current (V/I) converter that converts the voltage source test stimulus signals to current source test stimulus signals, and that outputs the current source test stimulus signals directly to a signal input pin of the device under test, wherein current levels of the current source test stimulus signals generated by the V/I converter are maintained at a constant level, regardless of changes in internal impedance at signal input pins of the device under test.

2. The apparatus of claim 1, wherein the voltage source test stimulus signals are output through output pins of the voltage source generation unit, and the V/I converter is connected to the output pins of the voltage source generation unit, and includes a plurality of V/I conversion circuits that convert the voltage source test stimulus signals having fixed analog voltage levels into the current source test stimulus signals having currents of designated levels.

3. The apparatus of claim 2, wherein each of the V/I conversion circuits comprises:

an operational amplifier (OP amp) having a non-inverting terminal connected to the voltage source generation unit via a first resistor, an inverting terminal connected to a ground voltage via a second resistor, and an output terminal connected to a first node, that outputs a first voltage to the first node in response to the fixed analog voltage applied to the non-inverting terminal;

a third resistor forming a negative feedback loop with the OP amp, connected between the inverting terminal of the OP amp and the first node;

a fourth resistor forming a positive feedback loop with the OP amp, connected between the non-inverting terminal of the OP amp and a second node; and a fifth resistor connected between the first node and the second node, wherein a first current determined by the first voltage of the first node and a second voltage of the second node, flows through the fifth resistor.

4. The apparatus of claim 3, wherein the second voltage is an internal bias voltage of the device under test.

5. The apparatus of claim 3, wherein the first current is divided into a second current and a third current at the second node, and each of the current source test stimulus signals has a level that is substantially equal to that of the second current.

6. The apparatus of claim 5, wherein the resistance of the fourth resistor is larger than the resistance of the fifth resistor, and the second current is larger than the third current flowing through the fourth resistor.

7. The apparatus of claim 3, wherein the fixed analog voltage is equal to a difference between the first voltage and the second voltage, and when the resistance of the fifth resistor is changed, the size of the first current is changed.

8. The apparatus of claim 3, wherein the first through fourth resistors all have substantially the same resistance value.

9. The apparatus of claim 1, wherein the voltage source generation unit generates pairs of voltage source test stimulus signals having complementary voltage levels and the V/I converter includes pairs of V/I conversion circuits that convert the pairs of voltage source test stimulus signals into pairs of current source test stimulus signals and that output the pairs of current source test stimulus signals, wherein the currents of each pair of current source test stimulus signals have levels that are within a predetermined range.

10. An apparatus for generating test stimulus signals in a test system testing the operation efficiency of a device under test, the apparatus comprising:

a voltage source generation unit that converts source data stored in an internal memory into an analog signal, and that generates voltage source test stimulus signals by combining the analog signal and a reference signal at a DC voltage level; and a voltage to current (V/I) converter that converts the voltage source test stimulus signals to current source test stimulus signals, and that outputs the current source test stimulus signals to the device under test, wherein the voltage source test stimulus signals are output through output pins of the voltage source generation unit, and the V/I converter is connected to the output pins of the voltage source generation unit, and includes a plurality of V/I conversion circuits that convert the voltage source test stimulus signals having fixed analog voltage levels into the current source test stimulus signals having currents of designated levels, and wherein each of the V/I conversion circuits includes:

an operational amplifier (OP amp) having a non-inverting terminal connected to the voltage source generation unit via a first resistor, an inverting terminal connected to a ground voltage via a second resistor, and an output terminal connected to a first node, that outputs a first voltage to the first node in response to the fixed analog voltage applied to the non-inverting terminal;

a third resistor forming a negative feedback loop with the OP amp, connected between the inverting terminal of the OP amp and the first node;

a fourth resistor forming a positive feedback loop with the OP amp, connected between the non-inverting terminal of the OP amp and a second node; and a fifth resistor connected between the first node and the second node, wherein a first current determined by the first voltage of the first node and a second voltage of the second node, flows through the fifth resistor;

wherein the current levels of the current source test stimulus signals generated by the V/I converter are maintained at a constant level, regardless of changes in internal impedance at input pins of the device under test.

11. The apparatus of claim 10, wherein the second voltage is an internal bias voltage of the device under test.

12. The apparatus of claim 10, wherein the first current is divided into a second current and a third current at the second node, and each of the current source test stimulus signals has a level that is substantially equal to that of the second current.

13. The apparatus of claim 12, wherein the resistance of the fourth resistor is larger than the resistance of the fifth resistor, and the second current is larger than the third current flowing through the fourth resistor.

14. The apparatus of claim 10, wherein the fixed analog voltage is equal to a difference between the first voltage and the second voltage, and when the resistance of the fifth resistor is changed, the size of the first current is changed.

15. The apparatus of claim 10, wherein the first through fourth resistors all have substantially the same resistance value.

16. The apparatus of claim 10, wherein the voltage source generation unit generates pairs of voltage source test stimulus signals having complementary voltage levels and the V/I converter includes pairs of V/I conversion circuits that convert the pairs of voltage source test stimulus signals into pairs of current source test stimulus signals and that output the pairs of current source test stimulus signals, wherein the currents of each pair of current source test stimulus signals have levels that are within a predetermined range.

* * * * *